US012764886B2

(12) United States Patent
Zhu et al.

(10) Patent No.: US 12,764,886 B2
(45) Date of Patent: Oct. 13, 2026

(54) ELECTRONIC CARD RETAINING DEVICE BASE STRUCTURE

(71) Applicant: FOSITEK CORPORATION, New Taipei City (TW)

(72) Inventors: Han Cheng Zhu, New Taipei City (TW); Ya Chih Huang, New Taipei City (TW)

(73) Assignee: Fositek Corporation, New Taipei City (TW)

( * ) Notice: Subject to any disclaimer, the term of this patent is extended or adjusted under 35 U.S.C. 154(b) by 171 days.

(21) Appl. No.: 18/676,790

(22) Filed: May 29, 2024

(65) Prior Publication Data

US 2025/0311136 A1 Oct. 2, 2025

(30) Foreign Application Priority Data

Mar. 29, 2024 (TW) ................................ 113112134

(51) Int. Cl.
*H05K 7/14* (2006.01)

(52) U.S. Cl.
CPC ......... *H05K 7/1418* (2013.01); *H05K 7/1401* (2013.01)

(58) Field of Classification Search
CPC .. F16B 2/185; F16B 21/02; F16B 2/18; F16B 5/0635; G06F 1/183; G06F 1/185; G06F 1/186; H05K 7/12; H05K 7/1404; H05K 7/1405; H05K 7/1401; H05K 7/1418; H05K 7/142; H05K 7/1007; H05K 1/141; H01R 13/639; H01R 12/721; H01R 12/722

See application file for complete search history.

(56) References Cited

U.S. PATENT DOCUMENTS

| | | | | |
|---|---|---|---|---|
| 11,372,459 B2 * | 6/2022 | Tseng | ......................... | F16B 2/22 |
| 11,484,099 B2 * | 11/2022 | Wang | ..................... | H05K 1/184 |
| 2017/0090527 A1 * | 3/2017 | Chi | .......................... | H05K 7/12 |
| 2021/0168959 A1 * | 6/2021 | Xu | ....................... | H05K 7/1417 |
| 2022/0316508 A1 * | 10/2022 | Wang | .................... | F16B 5/0635 |
| 2025/0261316 A1 * | 8/2025 | Tseng | ...................... | G06F 1/185 |

FOREIGN PATENT DOCUMENTS

| | | | | |
|---|---|---|---|---|
| CN | 109659727 B * | 6/2020 | ........... | H01R 12/732 |

OTHER PUBLICATIONS

Machine Translation for CN109659727B (Year: 2025).*

* cited by examiner

*Primary Examiner* — Sagar Shrestha
*Assistant Examiner* — Peter Krim
(74) *Attorney, Agent, or Firm* — Rosenberg, Klein & Lee

(57) ABSTRACT

An electronic card retaining device base structure includes a base for mounting on a predetermined substrate and having a column-like support section and a elongated coupling section transversely connected to a lower end of the support section. The coupling section has a primary retaining end, which is provided at one side closer to the base with a protruded retaining section and can be obliquely extended through an elongated hollow-out slot preformed on the substrate to a lower side of the substrate, and an opposite secondary retaining end also extended through the elongated hollow-out slot. The coupling section is movable horizontally for the secondary retaining end to abut against an end of the elongated hollow-out slot while the protruded retaining section is moved into another end of the elongated hollow-out slot. With the above arrangements, the base structure can be repeatedly quickly mounted on and dismounted from the substrate.

16 Claims, 5 Drawing Sheets

ELECTRONIC CARD RETAINING DEVICE BASE STRUCTURE

FIELD OF THE INVENTION

The present invention relates to an electronic card retaining device base structure, and more particularly, to an electronic card retaining device base structure that is simple in structure, quick assembling and convenient for use, and space-saving.

BACKGROUND OF THE INVENTION

The conventional solid state drive (SSD) uses mSATA standard, which has limited overall capacity because the number of flash memories that can be provided on the printed circuit board (PCB) is limited. Therefore, a more recent standard named Next Generation Form Factor (NGFF) or M.2 is developed for using with solid state drive. Since M.2 standard allows flash memory chips to be provided on both sides of the circuit board, it has advantages like smaller volume, higher capacity, and lower manufacturing cost, compared to the conventional mSATA standard.

General solid state drive with M.2 standard has various length specifications available for choosing, and the motherboard for a computer may also be designed to allow for solid state drive of different length specifications. In response to the need of fixing solid state drives of different length specifications in place, in most cases, the solid state drives with M.2 standard are fastened to the computer motherboard by screws and bolts. However, the use of screws and bolts as fastening means will cause a lot of inconveniences in assembling and disassembling the solid state drives to and from the motherboard. Further, bolts must be embedded in the computer motherboard for the screws to fasten thereto. This would inevitably result in increased manufacturing cost. Therefore, it is an important issue for relevant manufacturers to workout a way of upgrading the efficiency in assembling the M.2 solid state drive to the motherboard while reducing the overall manufacturing cost.

Taiwan Patent Pub. No. I568334 discloses an assembling fastener structure, which includes a loading section, a pivotally connecting section, a protruding section, and a retaining and pressing section. The loading section includes a loading surface and a back surface opposing to the loading surface. The pivotally connecting section and the protruding section are projected from the back surface and the loading surface of the loading section, respectively, to extend along an axial direction of the pivotally connecting section. The retaining and pressing section is radially protruded from one side of the protruding section to extend along a radial direction of the pivotally connecting section, so that the retaining and pressing section and the loading section together form a retaining groove between them, and a release opening not covered by the retaining and pressing section is formed at a diametrically opposite side of the retaining groove.

In the above assembling fastener structure, the pivotally connecting section can be easily snapped into an assembling hole on a circuit board. Further, with the retaining and pressing section that circumferentially encloses almost one half of the protruding section, an operator is able to mount and dismount an expansion component simply by turning the assembling fastener structure less than one circle in case of requiring a solid state drive of different length specification and to upgrade the efficiency in assembling components on the motherboard. In addition, since the above assembling fastener structure is snapped onto the circuit board, no screw and matching bolt are needed to be embedded in the mounting hole on the circuit board to thereby further reduce the material cost of the motherboard.

However, to use the above assembling fastener structure, a tool such as a slotted screwdriver is needed to extend into an operating slot pre-formed on the protruding section to turn the protruding section of the assembling fastener structure until one of the opposing retaining groove and release opening is oriented to the solid state drive, so as to set the assembling fastener structure to a locking or a releasing state. Since the above assembling fastener structure must be operated with a specific tool, i.e. the slotted screwdriver, it is not so convenient for use.

Taiwan Patent Pub. No. I693332 discloses a latch, which includes a base, a push button, and an elastic element. The base has a case, a primary fixing section, a secondary fixing section, and an unlocking handle. The case defines an internal receiving space and has a window provided on each of two sides. The primary and the secondary fixing section are protruded from one side of the case; and the primary fixing section has two wing sections diametrically symmetrically extended outward from an outer surface thereof; and the unlocking handle is connected to the secondary fixing section. The push button is pivotally connected to the base and includes a pressing section for operating the unlocking handle and a locking section for locking an object thereto. The elastic element is disposed between the push button and the base. The push button is rotatable between a locking position and an unlocking position relative to the base, and is biased toward the locking position by the elastic element.

To use the above latch, first extend the primary fixing section of the base through a primary locating hole on a mounting surface and then rotate the base for the two wing sections of the primary fixing section to rotate and upward abut against two lateral sides of the primary fixing hole and be held thereto. Meanwhile, the secondary fixing section is brought to set in a secondary locating hole formed on the mounting surface near one side of the primary locating hole, such that the base is securely fixed to the mounting surface. When it is desired to remove the base from the mounting surface, an operator may pull the unlocking handle, such that the unlocking handle brings the secondary fixing section to release from the secondary locating hole and the base can be rotated in a reverse direction to its initial position. At this point, the two wing sections of the primary fixing section can be moved upward to separate from the primary fixing hole and the base can be removed from the mounting surface.

However, the above latch has the following disadvantages in practical application thereof:

(1) The base must be rotated when being fixed to or removed from the mounting surface, so that the two wing sections are abutted against or released from two lateral sides of the primary locating hole, respectively, to allow subsequent operations. For this purpose, it is necessary to reserve sufficient space on the mounting surface to allow for the rotation of the base. The provision of the wing sections forms a waste of space, which does not satisfy the requirement for compactness in the modern trends of electronic products.

(2) The rotation of the primary fixing section would cause rubbing between the wing sections and the mounting surface, such as a circuit board surface, and frequent rubbing would cause wearing of the circuit board surface.

(3) The latch needs an elastic element disposed between the push button and the base and accordingly, must include a locating mechanism designed according to the elastic element. Therefore, the latch includes various components, which result in complicated structure and time-consuming assembly of the latch, rendering the latch non-economical for use.

In view of the above disadvantages in the prior art fastening or latch structures in application, it is tried by the inventor to develop an improved electronic card retaining device base structure to overcome these disadvantages.

SUMMARY OF THE INVENTION

A primary object of the present invention is to provide an electronic card retaining device base structure, which includes a base for removably mounting on a predetermined substrate. The base includes a column-like support section and an elongated coupling section transversely connected to a lower end of the support section. The coupling section has a primary retaining end, which has a protruded retaining section provided on one side closer to the base; and a secondary retaining end opposite to the primary retaining end. The primary retaining end of the coupling section is obliquely extended through an elongated hollow-out slot preformed on the substrate to a lower side of the substrate; and the secondary retaining end of the coupling section is also extended through the elongated hollow-out slot. The coupling section is horizontally movable toward the secondary coupling end for the secondary retaining end to abut on an end of the elongated hollow-out slot while the protruded retaining section on the primary retaining end is extended into another end of the elongated hollow-out slot, such that the base is held to the substrate. The above base structure has simple structure and can be conveniently mounted on or dismounted from the substrate repeatedly according to actual need.

Another object of the present invention is to provide the above electronic card retaining device base structure, which further includes a spring plate extended from one side of the support section, and the spring plate has a protruded locating section provided on a free end thereof. The substrate further has a locating bore formed on an area outside an end of the elongated hollow-out slot. The protruded locating section on the spring plate is snapped into the locating bore when the coupling section of the base has been fully moved to the secondary coupling end, enabling the base to be more securely held to the substrate.

A further object of the present invention is to provide the above electronic card retaining device base structure, the base of which can be mounted on the substrate simply by sliding the base relative to the elongated hollow-out slot with one hand without any tool, and accordingly, is very convenient for use.

The structure and the technical means adopted by the present invention to achieve the above and other objects can be best understood by referring to the following detailed description of the preferred embodiments and the accompanying drawings; wherein

DETAILED DESCRIPTION OF THE PREFERRED EMBODIMENTS

Figure 1:
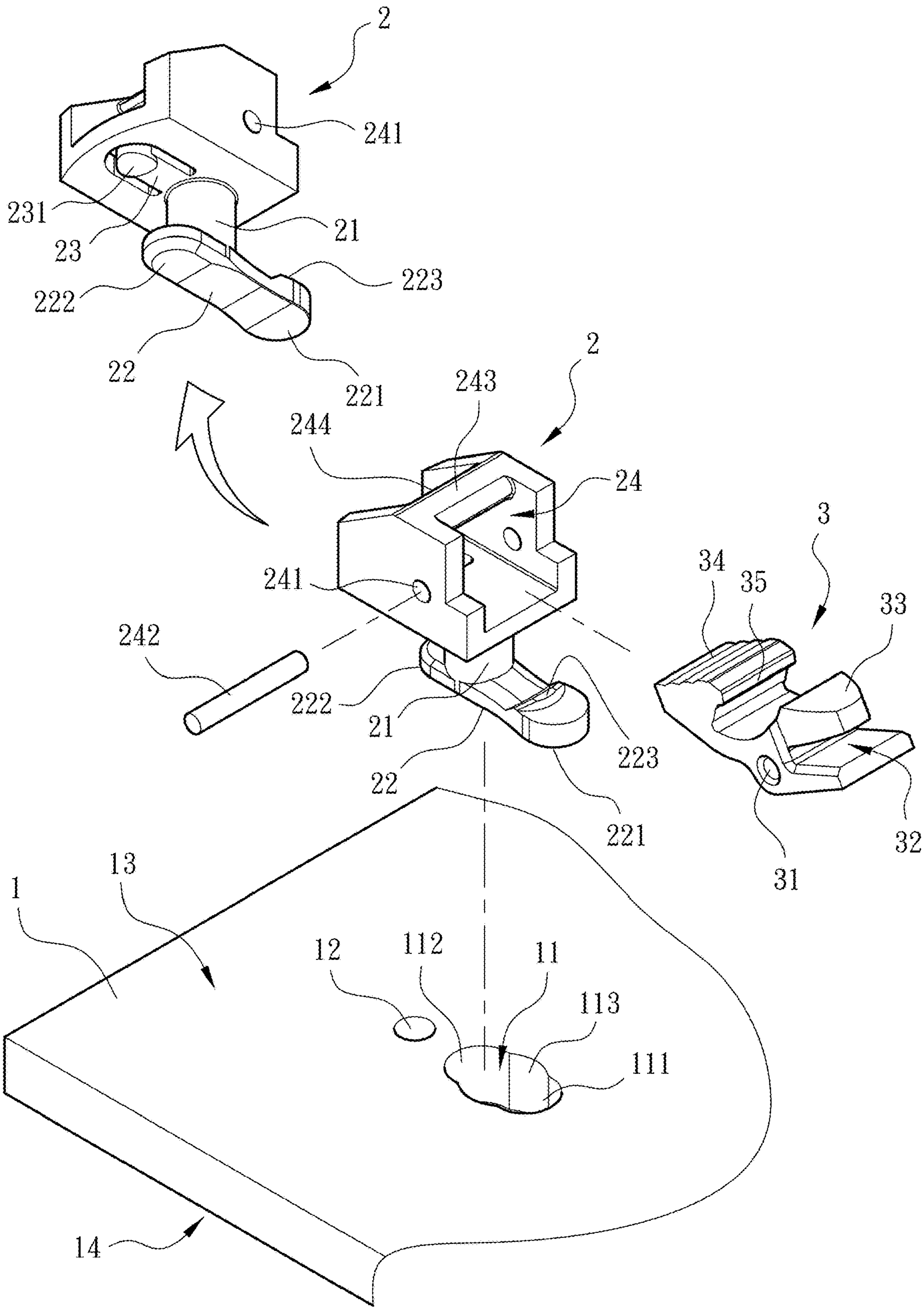
FIG. 1 is an exploded perspective view of an electronic card retaining device base structure according to a preferred embodiment of the present invention.
Figure 2:
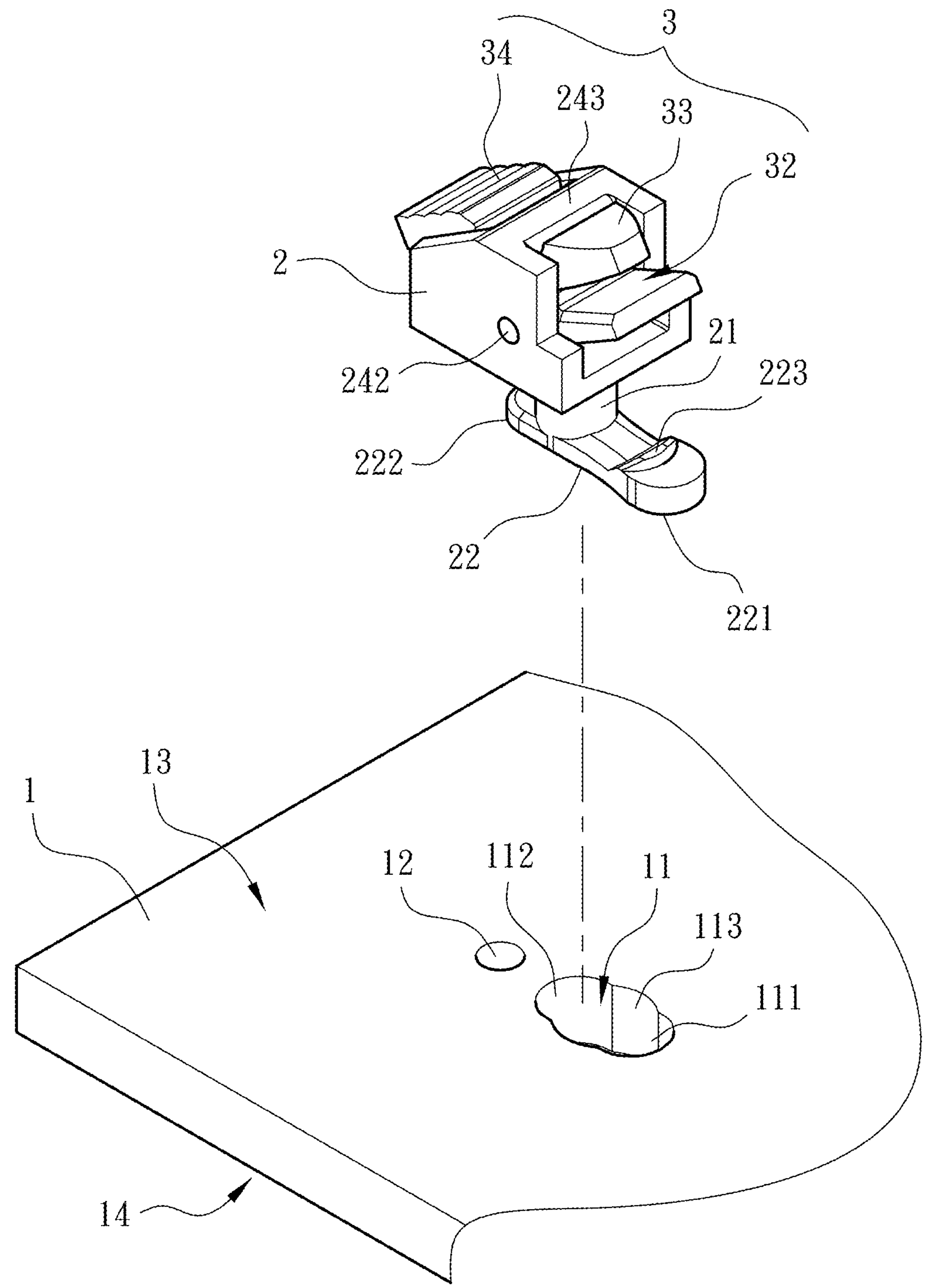
FIG. 2 is an assembled view of FIG. 1.

Please refer to FIGS. 1 and 2. An electronic card retaining device base structure according to a preferred embodiment of the present invention mainly includes a base 2 and a swingable clamp 3. The base 2 includes a column-like support section 21 vertically extended downward from a bottom side thereof. An end of the support section 21 farther away from the base 2 has an elongated flexible coupling section 22 horizontally connected thereto. The coupling section 22 is provided at two opposite ends with a primary retaining end 221 and a secondary retaining end 222, and the primary retaining end 221 is provided at one side closer to the base 2 with a protruded retaining section 223.

In an operable embodiment, the base 2 is further provided on its bottom side with a spring plate 23, which is located to one side of the support section 21 and extended in a direction the same as that of the secondary retaining end 222. A free end of the spring plate 23 is provided on one side facing toward the coupling section 22 with a protruded locating section 231. The base 2 has an open top formed into a recessed receiving space 24, two facing lateral sides of which are provided with a shaft hole 241 each for a pivot shaft 242 to extend therethrough and connect thereto. The base 2 further includes a stopper section 243, which is located above and extended parallel to the pivot shaft 242, and a slant guide surface 244 formed on the stopper section 243.

The swingable clamp 3 has a middle section provided with a pivot hole 31, through which the pivot shaft 242 is extended, such that the swingable clamp 3 is swingable about the pivot shaft 242 in the receiving space 24. The swingable clamp 3 is provided at an end with a clamping recess 32, at a position above the clamping recess 32 with a pressing section 33, at another end farther away from the clamping recess 32 with a push section 34, and at an end of the push section 34 facing toward the stopper section 243 with a locating section 35 corresponding to the slant guide surface 244.

Figure 3:
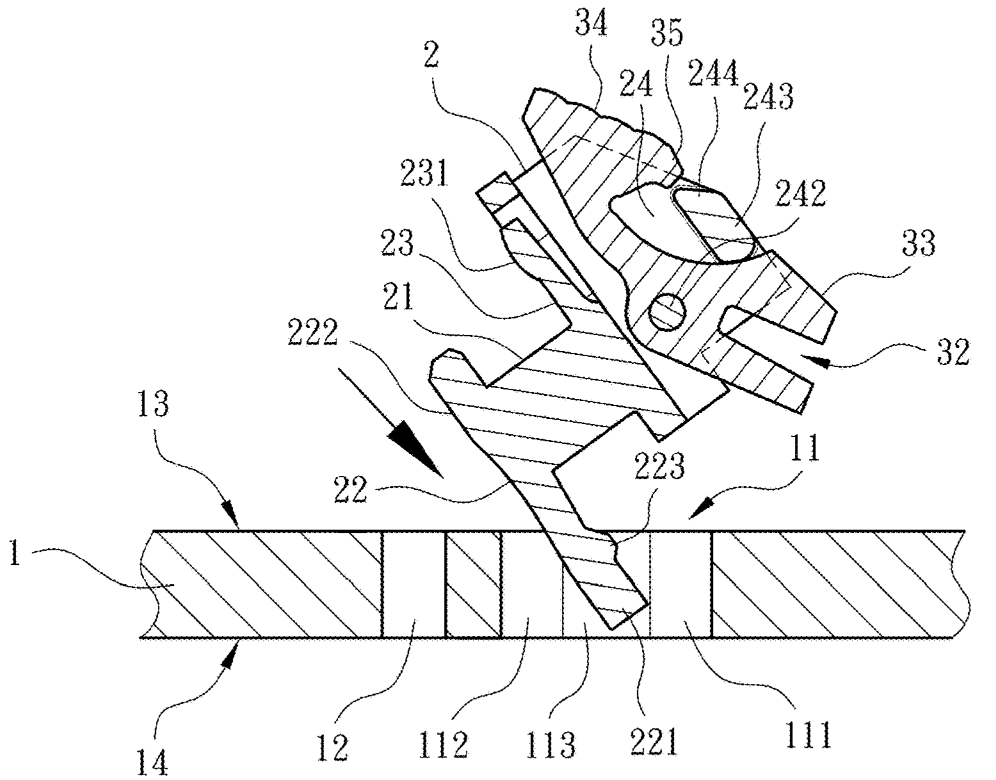
FIG. 3 is a sectional side view showing a first step of mounting the electronic card retaining device base structure of the present invention to a substrate.
Figure 4:
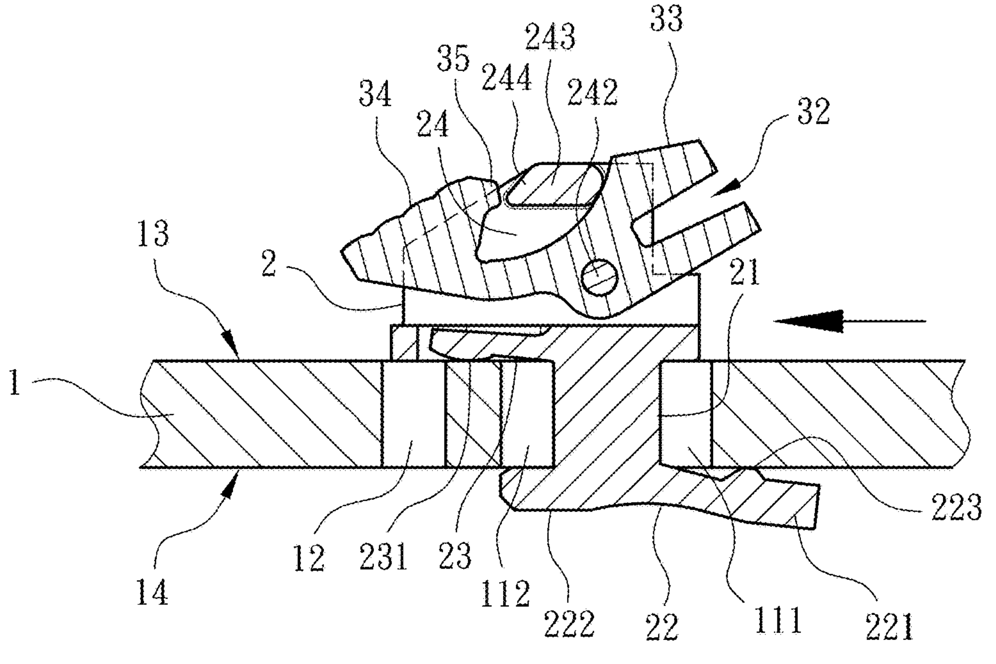
FIG. 4 is a sectional side view showing a second step of mounting the electronic card retaining device base structure of the present invention to the substrate.
Figure 5:
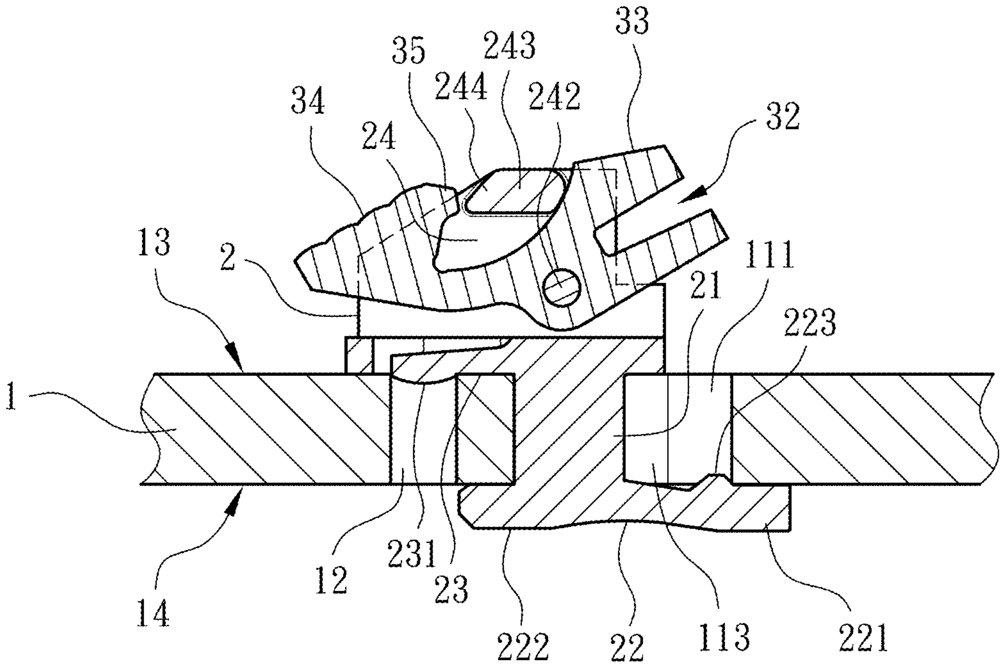
FIG. 5 is a sectional side view showing the electronic card retaining device base structure of the present invention having been fully mounted on the substrate.

Please refer to FIGS. 3, 4 and 5. In practical application of the electronic card retaining device base structure of the present invention, the base 2 is to be mounted on a substrate 1, which can be, for example, a motherboard. The substrate 1 has a top surface 13 and a bottom surface 14, and is provided with at least one elongated hollow-out slot 11, which has a length smaller than that of the coupling section 22. Depending on actual need, the elongated hollow-out slot 11 may include an intermediate passage 113 formed at a middle part of the elongated hollow-out slot 11 and having two outward expanded lateral sides. Two ends of the elongated hollow-out slot 11 are defined as a primary coupling end 111 and a secondary coupling end 112, respectively. The substrate 1 is further provided on an area outside and close to the secondary coupling end 112 with a locating bore 12.

To mount the base 2 on the substrate 1, the primary retaining end 221 of the coupling section 22 of the base 2 is pointed obliquely toward the top surface 13 of the substrate 1 to extend through the intermediate passage 113 of the elongated hollow-out slot 11 to the bottom surface 14 of the substrate 1 at a location adjacent to the primary coupling end 111, as shown in FIG. 3. The intermediate passage 113 having an increased width, with which the coupling section 22 can be conveniently adjusted to a suitable extending direction. Thereafter, the secondary retaining end 222 of the coupling section 22 is fully extended through the elongated hollow-out slot 11 and moved horizontally toward the secondary coupling end 112 of the elongated hollow-out slot 11, as shown in FIG. 4, such that the secondary retaining end 222 is abutted on the bottom surface 14 of the substrate 1 at a location adjacent to the secondary coupling end 112, while the protruded retaining section 223 on the primary retaining end 221 is moved into the primary coupling end 111 of the elongated hollow-out slot 11 to be held thereto. Meanwhile, the protruded locating section 231 on the spring plate 23 is snapped into the locating bore 12 formed on the substrate 1 near one side of the elongated hollow-out slot 11 to provide another locating mechanism, as shown in FIG. 5.

Figure 6:
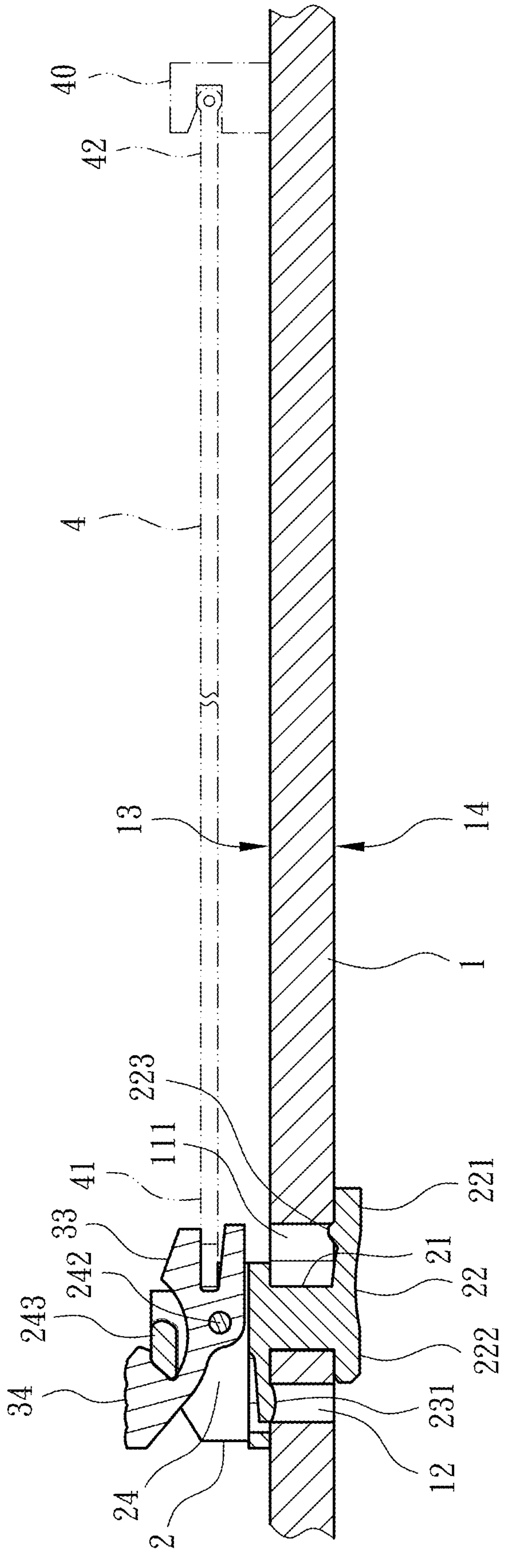
FIG. 6 shows the use of the present invention to retaining an electronic card in place on the substrate.

Please refer to FIG. 6, which shows the use of the present invention to retain an electronic card 4, such as a solid state drive, to be installed on the substrate 1. The electronic card 4 includes an electrical connecting end 42 provided with pins for plugging into a terminal socket 40 fixed on the substrate 1, and an opposite engaging end 41, which can be pressed downward for an edge of the engaging end 41 of the electronic card 4 to extend into the clamping recess 32 on the swingable clamp 3. At this point, the push section 34 of the swingable clamp 3 is tipped up while the electronic card 4 is pressed downward. When the push section 34 (i.e. the locating section 35) moves along the slant guide surface 244 until it is finally stopped by the stopper section 243 to be located in place, the electronic card 4 is also installed and located securely at a position for use while the edge at the engaging end 41 of the electronic card 4 is pressed by the pressing section 33 of the swingable clamp 3. Therefore, the electronic card 4 is held in place on the substrate 1, as shown in FIG. 6.

On the other hand, when it is desired to remove the electronic card 4 from the substrate 1, an external force can be applied to the push section 34 of the swingable clamp 3, such that the push section 34 is separated from the stopper section 243 and the clamping recess 32 located opposite to the push section 34 is tipped up. As a result, the pressing section 33 no longer holds down the edge of the electronic card 4, and an elastic force applied to the electrical connecting end 42 by the terminal socket 40 drives the engaging end 41 of the electronic card 4 to tip up. The engaging end 41 at the tipped-up position allows the electronic card 4 to be easily removed from the substrate 1.

In conclusion, the electronic card retaining device base structure according to the present invention indeed has the advantages of simplified structure, easy to mount and dismount, convenient to operate, and space-saving to meet the requirements of novelty and improvement for granting a patent. It is also understood the present invention has been described with a preferred embodiment thereof and many changes and modifications in the described embodiment can be carried out without departing from the scope and the spirit of the invention that is intended to be limited only by the appended claims.

What is claimed is:

1. An electronic card retaining device base structure, comprising:

a base (2) for mounting on a substrate (1), which has an elongated hollow-out slot (11) provided thereon; the base (2) including a column-like support section (21) extended downward from a bottom side thereof, and an elongated coupling section (22) transversely connected to a lower end of the support section (21); a length of the elongated hollow-out slot (11) being less than that of a length of the coupling section (22); the coupling section (22) having an end being a primary retaining end (221), which is provided at one side closer to the base (2) with a protruded retaining section (223) and is obliquely extendable through the elongated hollow-out slot (11) to a lower side thereof, and another end being a secondary retaining end (222) also extended through the elongated hollow-out slot (11); and the coupling section (22) being movable horizontally in a direction away from the primary retaining end (221) for the secondary retaining end (222) to abut against the lower side of the elongated hollow-out slot (11) at an end thereof while the protruded retaining section (223) on the primary retaining end (221) is moved into another end of the elongated hollow-out slot (11) to be held thereto.

2. The electronic card retaining device base structure as claimed in claim 1, wherein the substrate (1) further includes a locating bore (12) located on an area outside an end of the elongated hollow-out slot (11), and the base (2) is provided on its bottom side with a spring plate (23), which is located to one side of the support section (21); and the spring plate (23) being provided with a protruded locating section (231) for snapping into the locating bore (12).

3. The electronic card retaining device base structure as claimed in claim 2, wherein the elongated hollow-out slot (11) on the substrate (1) has a middle part formed into an intermediate passage (113) that has two outward expanded lateral sides to facilitate convenient adjustment of a direction in which the primary retaining end (221) of the coupling section (22) of the base (2) is obliquely extended into the elongated hollow-out slot (11).

4. The electronic card retaining device base structure as claimed in claim 3, wherein the base (2) has an open top formed into a recessed receiving space (24) for receiving a swingable clamp (3) therein; and the swingable clamp (3) received in the receiving space (24) being pivotally connected to the base (2) via a pivot shaft (242) extended through a middle section of the swingable clamp (3).

5. The electronic card retaining device base structure as claimed in claim 4, wherein the swingable clamp (3) has an end provided with a champing recess (32) for clamping an edge of an electronic card (4) thereto, and another end opposite to the clamping recess (32) provided with a push section (34); and the base (2) further including a stopper section (243) transversely located at a middle portion of the open top of the receiving space (24) to rest on the swingable clamp (3) between the clamping recess (32) and the push section (34).

6. The electronic card retaining device base structure as claimed in claim 5, wherein the swingable clamp (3) further includes a pressing section (33) located above the clamping recess (32), and the pressing section (33) being pressed on a top of the edge of the electronic card (4) that is clamped to the clamping recess (32).

7. The electronic card retaining device base structure as claimed in claim 2, wherein the base (2) has an open top formed into a recessed receiving space (24) for receiving a swingable clamp (3) therein; and the swingable clamp (3) received in the receiving space (24) being pivotally connected to the base (2) via a pivot shaft (242) extended through a middle section of the swingable clamp (3).

8. The electronic card retaining device base structure as claimed in claim 7, wherein the swingable clamp (3) has an end provided with a champing recess (32) for clamping an edge of an electronic card (4) thereto, and another end opposite to the clamping recess (32) provided with a push section (34); and the base (2) further including a stopper section (243) transversely located at a middle portion of the open top of the receiving space (24) to rest on the swingable clamp (3) between the clamping recess (32) and the push section (34).

9. The electronic card retaining device base structure as claimed in claim 8, wherein the swingable clamp (3) further includes a pressing section (33) located above the clamping recess (32), and the pressing section (33) being pressed on a top of the edge of the electronic card (4) that is clamped to the clamping recess (32).

10. The electronic card retaining device base structure as claimed in claim 1, wherein the elongated hollow-out slot (11) on the substrate (1) has a middle part formed into an intermediate passage (113) that has two outward expanded lateral sides to facilitate convenient adjustment of a direction in which the primary retaining end (221) of the coupling section (22) of the base (2) is obliquely extended into the elongated hollow-out slot (11).

11. The electronic card retaining device base structure as claimed in claim 10, wherein the base (2) has an open top formed into a recessed receiving space (24) for receiving a swingable clamp (3) therein; and the swingable clamp (3) received in the receiving space (24) being pivotally connected to the base (2) via a pivot shaft (242) extended through a middle section of the swingable clamp (3).

12. The electronic card retaining device base structure as claimed in claim 11, wherein the swingable clamp (3) has an end provided with a champing recess (32) for clamping an edge of an electronic card (4) thereto, and another end opposite to the clamping recess (32) provided with a push section (34); and the base (2) further including a stopper section (243) transversely located at a middle portion of the open top of the receiving space (24) to rest on the swingable clamp (3) between the clamping recess (32) and the push section (34).

13. The electronic card retaining device base structure as claimed in claim 12, wherein the swingable clamp (3) further includes a pressing section (33) located above the clamping recess (32), and the pressing section (33) being pressed on a top of the edge of the electronic card (4) that is clamped to the clamping recess (32).

14. The electronic card retaining device base structure as claimed in claim 1, wherein the base (2) has an open top formed into a recessed receiving space (24) for receiving a swingable clamp (3) therein; and the swingable clamp (3) received in the receiving space (24) being pivotally connected to the base (2) via a pivot shaft (242) extended through a middle section of the swingable clamp (3).

15. The electronic card retaining device base structure as claimed in claim 14, wherein the swingable clamp (3) has an end provided with a champing recess (32) for clamping an edge of an electronic card (4) thereto, and another end opposite to the clamping recess (32) provided with a push section (34); and the base (2) further including a stopper section (243) transversely located at a middle portion of the open top of the receiving space (24) to rest on the swingable clamp (3) between the clamping recess (32) and the push section (34).

16. The electronic card retaining device base structure as claimed in claim 15, wherein the swingable clamp (3) further includes a pressing section (33) located above the clamping recess (32), and the pressing section (33) being pressed on a top of the edge of the electronic card (4) that is clamped to the clamping recess (32).

* * * * *